United States Patent
Chang et al.

(10) Patent No.: US 7,061,769 B1
(45) Date of Patent: Jun. 13, 2006

(54) USB/OTG-INTERFACE STORAGE CARD

(76) Inventors: Jung-Che Chang, 1F, No. 1, Yonghe St., Taiping City, Taichung County 411 (TW); Yi-Chien Su, 1F, No. 1, Yonghe St., Taiping City, Taichung County 411 (TW)

( * ) Notice: Subject to any disclaimer, the term of this patent is extended or adjusted under 35 U.S.C. 154(b) by 0 days.

(21) Appl. No.: 11/076,933

(22) Filed: Mar. 11, 2005

(51) Int. Cl.
*H05K 7/02* (2006.01)
*G06K 19/067* (2006.01)
*G06K 19/077* (2006.01)

(52) U.S. Cl. .................. 361/737; 235/492; 439/76.1; 257/679

(58) Field of Classification Search ............. 361/737; 235/492; 257/679; 439/76.1
See application file for complete search history.

(56) References Cited

U.S. PATENT DOCUMENTS

| | | | | | |
|---|---|---|---|---|---|
| 4,789,776 | A | * | 12/1988 | Inoue | 235/492 |
| 5,237,165 | A | * | 8/1993 | Tingley, III | 235/492 |
| D393,458 | S | * | 4/1998 | Merlin et al. | D14/437 |
| 5,841,122 | A | * | 11/1998 | Kirchhoff | 235/492 |
| 6,184,579 | B1 | * | 2/2001 | Sasov | 257/712 |
| 6,193,163 | B1 | * | 2/2001 | Fehrman et al. | 235/488 |
| 6,252,777 | B1 | * | 6/2001 | Ikeda et al. | 361/737 |
| 6,438,638 | B1 | * | 8/2002 | Jones et al. | 710/301 |
| 6,452,806 | B1 | * | 9/2002 | Ikeda et al. | 361/737 |
| 6,454,585 | B1 | * | 9/2002 | Homer et al. | 439/218 |
| 6,554,193 | B1 | * | 4/2003 | Fehrman et al. | 235/488 |
| 6,626,690 | B1 | * | 9/2003 | Homer et al. | 439/218 |
| 6,644,555 | B1 | * | 11/2003 | Berney | 235/492 |
| 6,744,634 | B1 | * | 6/2004 | Yen | 361/752 |
| 6,813,164 | B1 | * | 11/2004 | Yen | 361/785 |
| 6,890,188 | B1 | * | 5/2005 | Le | 439/76.1 |
| 6,900,988 | B1 | * | 5/2005 | Yen | 361/737 |
| 2002/0116668 | A1 | * | 8/2002 | Chhor et al. | 714/42 |
| 2003/0100203 | A1 | * | 5/2003 | Yen | 439/79 |
| 2004/0027809 | A1 | * | 2/2004 | Takahashi et al. | 361/737 |
| 2004/0027812 | A1 | * | 2/2004 | Yen | 361/752 |

* cited by examiner

*Primary Examiner*—Kamand Cuneo
*Assistant Examiner*—Dameon E. Levi
(74) *Attorney, Agent, or Firm*—Birch, Stewart, Kolasch & Birch, LLP

(57) ABSTRACT

The present invention discloses an USB/OTG-interface storage card, wherein the USB/OTG interface unit is planarized such that the volume thereof can be reduced obviously and the USB/OTG-interface storage card can be more lightweight, slim. Further, the planarized interface unit enables the USB/OTG-interface storage card to be inserted completely inside a slot of an electronic device, and therefore, the user will no more scruple the bumps induced by the conventional USB/OTG-interface storage device's projecting from the electronic device.

26 Claims, 6 Drawing Sheets

USB/OTG-INTERFACE STORAGE CARD

BACKGROUND OF THE INVENTION

1. Field of the Invention

The present invention relates to a portable data storage device, particularly to an USB/OTG-interface storage card.

2. Description of Related Art

The record is a key in the culture transference. Evolved from the grass-knotting as the records for events in an immemorial age, through the writing on a bamboo with a knife in ancient China, the recording of data has now come into a digital age, and to meet the demand for the convenience of storage, carry-about, and display, the portable storage device appears.

Owing to its compact size, capability of repeated read/write, much higher storage capacity than the conventional floppy disc, the USB-interface storage device is the top one among the current portable storage devices. Refer to FIG. 1 a schematic perspective diagram of the conventional USB-interface storage device. The conventional USB-interface storage device 10 has an USB plug 12, which is inserted to connect with an USB socket of a computer to read the data stored thereinside.

When the conventional USB-interface storage device 10 is inserted to connect with a portable electronic device, such as notebook computer, the portable disc will project outward from the portable electronic device, and it will make the portable electronic device, which lays stress on the integral appearance design, not refined enough. Further, the portable disc projecting outward is apt to incur bumps when the portable electronic device moves, which results in much inconvenience.

Therefore, the present invention provides an USB/OTG-interface storage card to solve the problem mentioned above.

SUMMARY OF THE INVENTION

The primary objective of the present invention is to provide an USB/OTG-interface storage card, which can provide the user with more convenience to move the portable electronic device needing a storage medium without the scruple of the bumps induced by the conventional USB-interface storage device's projecting from an electronic device.

Another objective of the present invention is to provide an USB/OTG-interface storage card, which can reduce the manufacture cost of the USB interface unit and has a foolproof function.

Yet another objective of the present invention is to provide an USB/OTG-interface storage card, whereof the size is reduced to being obviously smaller than that of a conventional USB-interface storage device and the portability is increased.

Further another objective of the present invention is to provide an USB/OTG-interface storage card, wherein the installing direction is not limited and further a more humanized portable storage device is provided.

To achieve the aforementioned objectives, the present invention provides an USB/OTG-interface storage card, which comprises: a card-type casing with an opening on the bottom face; a circuit board inside the card-type casing, whereon a planar USB/OTG interface unit is formed to connect with an electronic device with the planar USB/OTG interface unit outcropping from the opening; a memory unit on the circuit board; and a micro-controller, which controls the read/write activities of the memory unit to enable the data to be written into the memory unit from the electronic device or to be read out from the memory unit into the electronic device.

In another embodiment of the present invention, the USB/OTG-interface storage card comprises: a card-type casing with several openings along the perimeter; a circuit board inside the card-type casing, whereon several planar USB/OTG interface units are formed to connect with an electronic device with the planar USB/OTG interface units outcropping from the openings; a memory unit on the circuit board; and a micro-controller, which controls the read/write activities of the memory unit to enable the data to be written into the memory unit from the electronic device or to be read out from the memory unit into the electronic device.

Via the preferred embodiments described below in cooperation with the attached drawings, the structure characteristics and accomplishments of the present invention is to be further clarified.

PREFERRED EMBODIMENTS OF THE INVENTION

The present invention relates to an USB/OTG-interface storage card, particularly to one, which can apply to electronic devices that need a storage medium, such as personal computer, digital video recording device, digital mobile device, etc.

Figure 1:
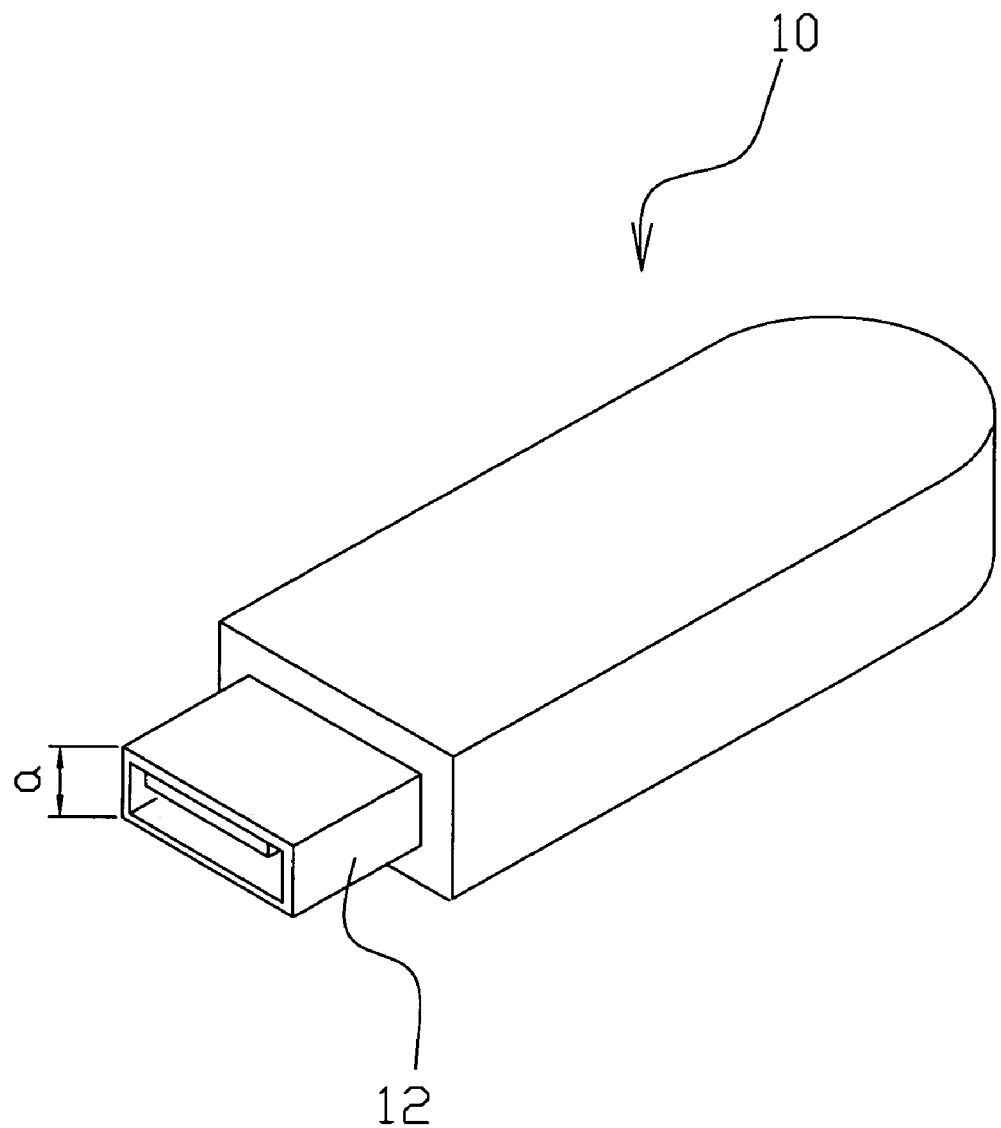
FIG. 1 is a schematic perspective diagram of a conventional USB-interface storage device.
Figure 2:
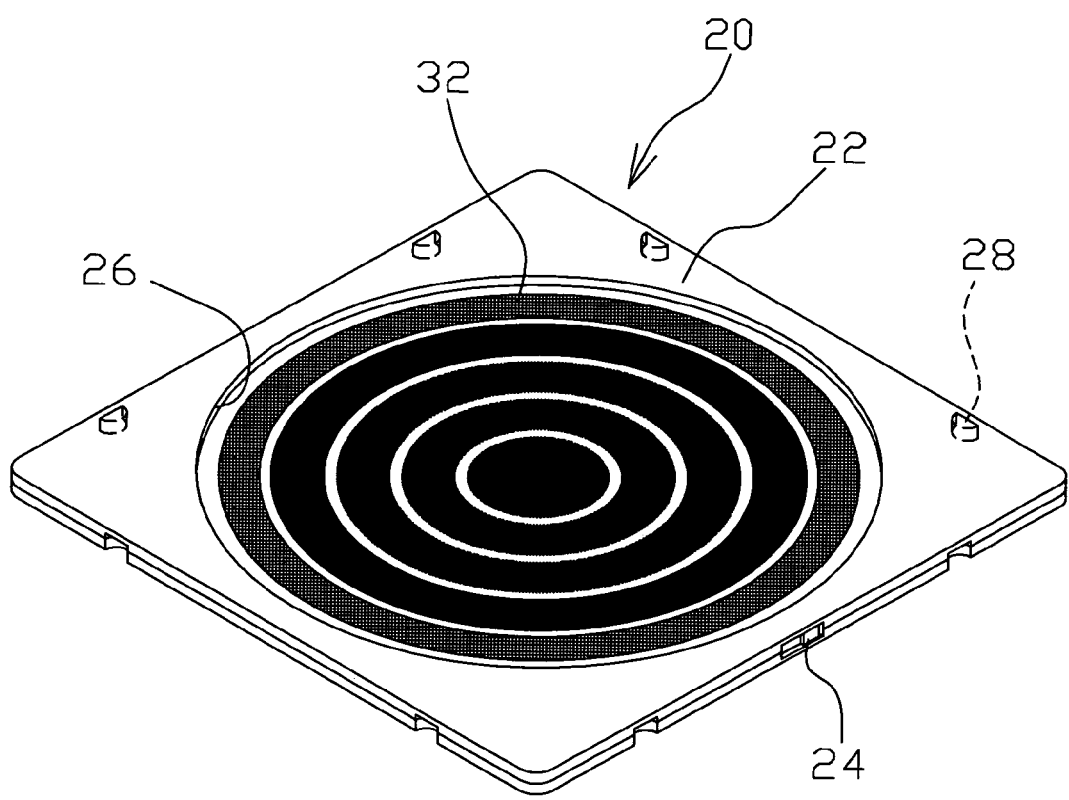
FIG. 2 is a schematic appearance diagram of one embodiment of the present invention.
Figure 3:
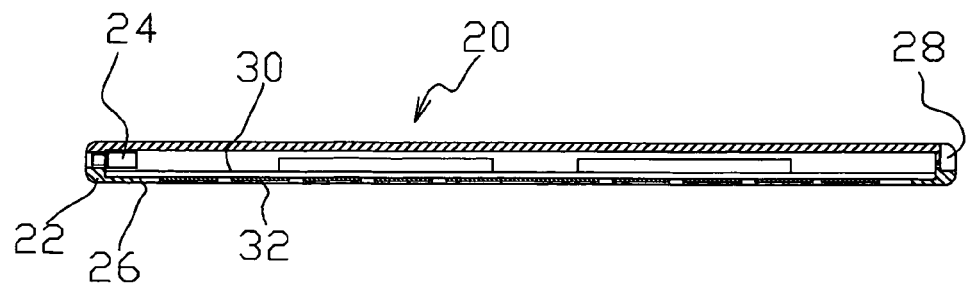
FIG. 3 is a side view of one embodiment of the present invention.
Figure 4:
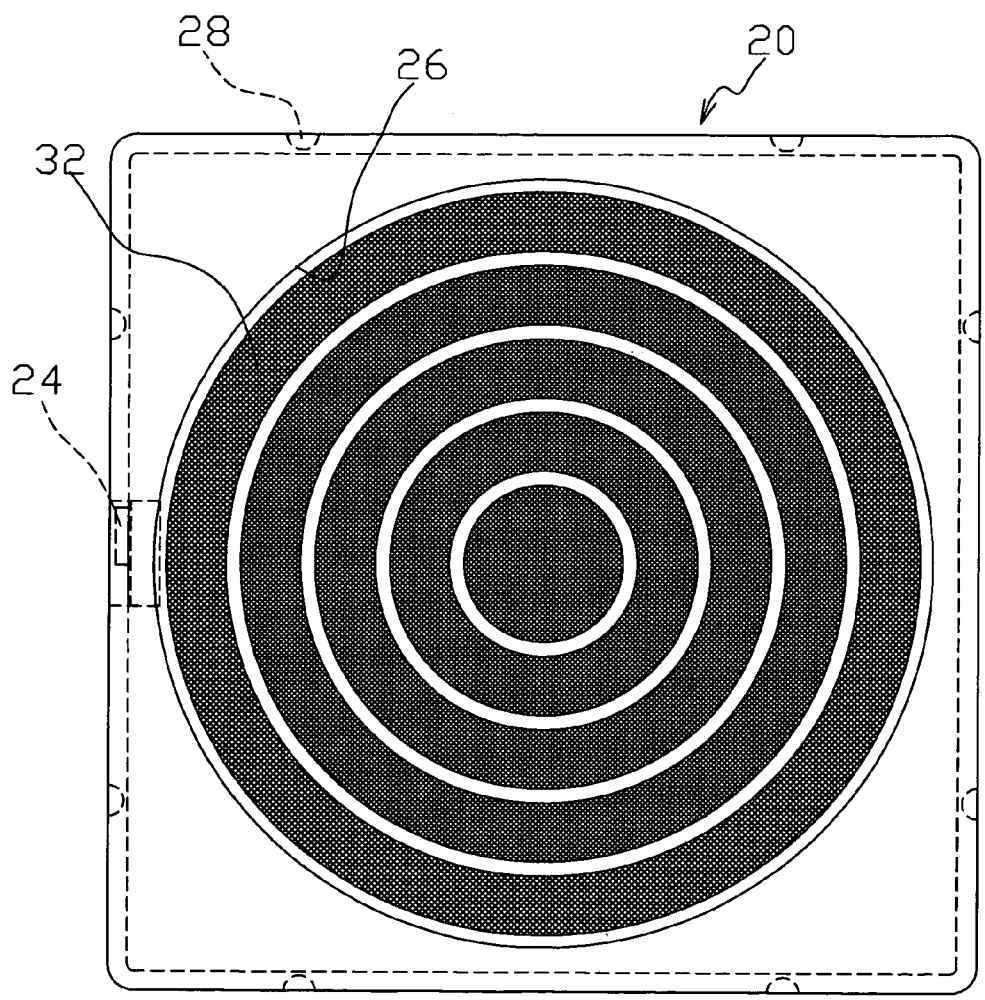
FIG. 4 is a bottom view of one embodiment of the present invention.

Refer to FIG. 2, FIG. 3, and FIG. 4 respectively an outside view, a side view, and a bottom view of the USB/OTG-interface storage card of the present invention. The USB/OTG-interface storage card 20 of the present invention comprises: a card-type casing 22; a switch 24 on the card-type casing 22 for the setting of write-protection, which can also be of a concealed design, i.e. the switch does not project outward from the card-type casing 22; an opening 26 on the bottom of the card-type casing 22; positioning press-fit slots 28 along the perimeter of the card-type casing 22; a circuit board 30 inside the card-type casing 22 (as shown in FIG. 3), wherein the circuit board adopts a direct layout to form a planar USB/OTG interface unit 32 to connect with an electronic device, and the planar USB/OTG interface unit 32 outcrops from the opening 26. The abovementioned direct layout can effectively reduce the manufacture cost of the USB/OTG interface unit.

As shown in FIG. 4, the present invention's planar USB/OTG interface unit 32 has five concentric circles, which are GND, ID, D+, D− and VBUS contacts from the exterior to the interior, and the electronic device can be a
} portable electronic device, a digital camera, a computer device, or a notebook computer, etc., which needs a storage device.

Figure 5:
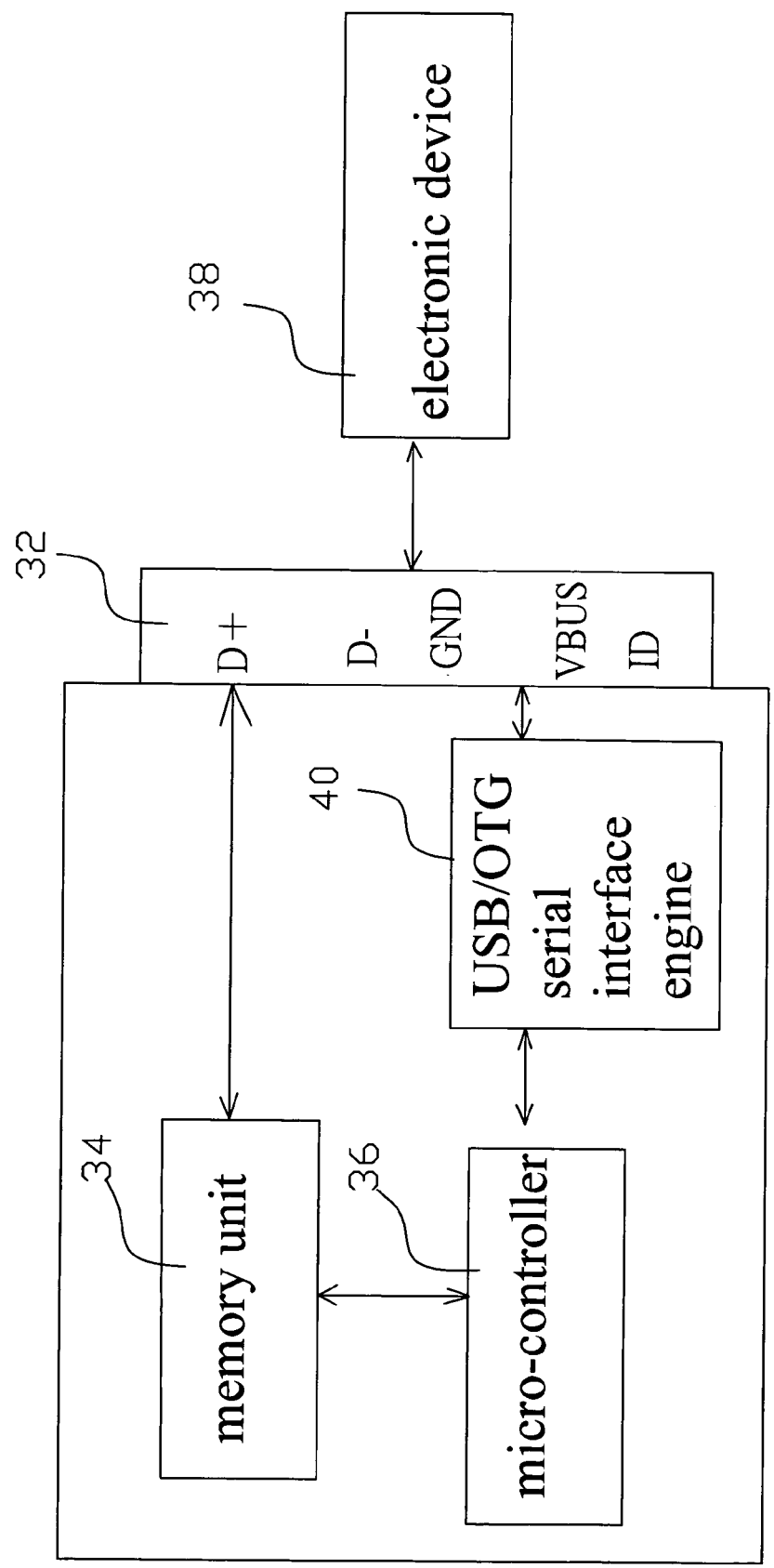
FIG. 5 is a functional block diagram according to one aspect of the present invention.

Referring also to FIG. 5, the circuit board 30 integrates: a memory unit 34, which can be a non-volatile memory or a flash memory; a micro-controller 36, which controls the read/write activities of the memory unit 34 to enable the data to be written into the memory unit 34 from the electronic device 38 or to be read out from the memory unit 34 into the electronic device 38; and a USB/OTG serial interface engine 40, which transforms the data of the micro-controller 36 into electric signals, and which can be also integrated with the micro-controller 36.

Figure 6:
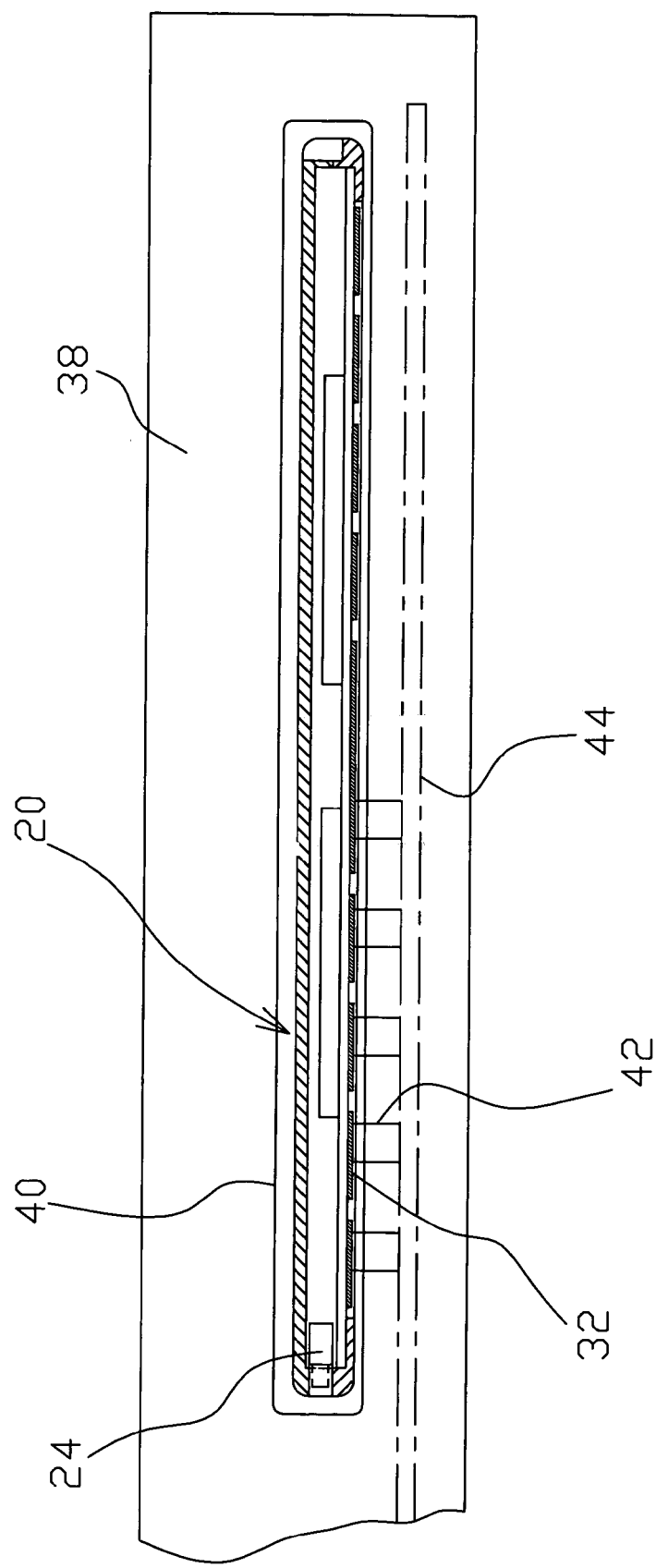
FIG. 6 is a diagram showing that the present invention is inserted inside an electronic device.

Refer to FIG. 6 a schematic diagram showing that the USB/OTG-interface storage card 20 is inserted into an electronic device 38. As the USB/OTG interface unit 32 is arranged on the circuit board 30 with direct layout to form a planar USB/OTG interface unit 32, the USB/OTG-interface storage card 20 can be completely installed inside a corresponding insertion slot 42 without the drawback of the USB/OTG-interface storage device's projecting outward from the electronic device 38 as in the conventional product. Therefore, the electronic device 38 utilizing the USB/OTG-interface storage card 20 of the present invention can be moved more freely without scrupling the bumps incurred by the projection from the electronic device, and the refined appearance of the electronic device 38 will not be influenced. Further, as the USB/OTG-interface storage card 20 of the present invention is, omni-directional, the user can installs it into the electronic device 38 from any direction to perform data access. Furthermore, the design that has contacts on four sides will effectively prolong the life of the present invention.

On the side of the electronic device 38, the data access between the memory unit 34 and the electronic device 38 is undertaken via several elastic electrically-conductive plate 46, which are installed on the circuit board 44 and correspond to the planar USB/OTG interface unit 32.

Figure 7:
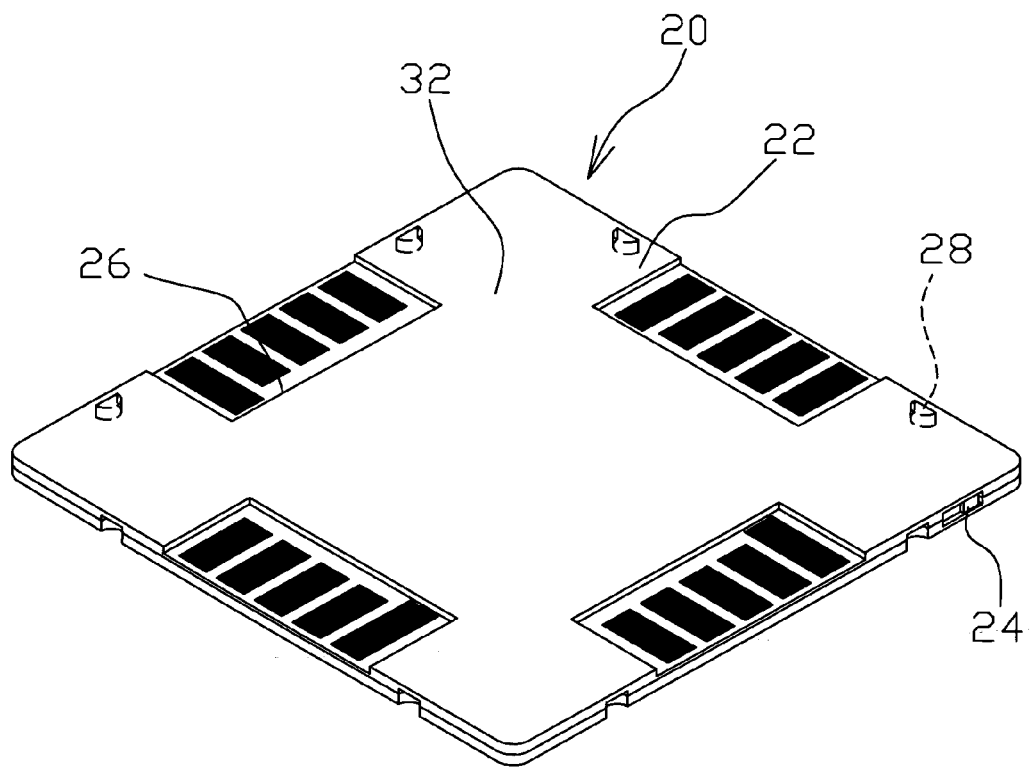
FIG. 7 is a bottom view of another embodiment of the present invention.

Refer to FIG. 7 a bottom view of another embodiment of the USB/OTG-interface storage card of the present invention. In this embodiment, the planar USB/OTG interface unit of five concentric circles mentioned above is modified into golden finger-type planar USB/OTG interface units 48, which are separately disposed on four sides of the card-type casing 22, and for the outcrop of the golden finger-type planar USB/OTG interface units 48, the opening 26, wherefrom the USB/OTG interface unit of five concentric circles outcrops, is modified into four opening 50 disposed on four sides of the card-type casing 22, as shown in FIG. 7. The golden finger-type USB/OTG interface unit 48 comprises: GND, ID, D+, D− and VBUS in sequence.

In summary, the present invention provides an USB/OTG-interface storage card, wherein the USB/OTG interface unit thereof adopts a direct layout; thus, the problem that the conventional USB interface unit is too large to fit inside the interior of the electronic device can be effectively solved; further, via the forming method of the USB/OTG interface unit of the present invention, the process cost can be effectively saved, and the size of the USB/OTG-interface storage card can be effectively reduced, so that the portability and the life thereof is increased and the mobility of the portable electronic device with the USB/OTG-interface storage card is also raised.

Those described above are only the preferred embodiments of the present invention, and any equivalent modification and variation is to be included within the scope of the present invention.

What is claimed is:

1. An USB/OTG-interface storage card, comprising:
   a card casing, with an opening on the bottom of said card casing;
   a circuit board, disposed inside said card casing, wherein a planar USB/OTG interface unit is formed on said circuit board to connect with an electronic device and said planar USB/OTG interface unit outcrops from said opening;
   a memory unit, disposed on said circuit board; and
   a micro-controller, which controls the read/write activities of said memory unit to enable data to be written into said memory unit from said electronic device or to be read out from said memory unit into said electronic device: and wherein said planar USB/OTG interface unit has an appearance of five concentric circles.

2. The USB/OTG-interface storage card according to claim 1, wherein said USB/OTG interface unit is formed on said circuit board with a direct layout.

3. The USB/OTG-interface storage card according to claim 1, wherein said electronic device is a portable electronic device.

4. The USB/OTG-interface storage card according to claim 1, wherein said electronic device is a digital camera.

5. The USB/OTG-interface storage card according to claim 1, wherein said electronic device is a computer.

6. The USB/OTG-interface storage card according to claim 1, wherein said electronic device is a notebook computer.

7. The USB/OTG-interface storage card according to claim 1, wherein said micro-controller further comprises an USB/OTG serial interface engine to transform said data of said micro-controller into electric signals.

8. The USB/OTG-interface storage card according to claim 1, which further comprises an USB/OTG serial interface engine to transform said data of said micro-controller into electric signals.

9. The USB/OTG interface storage card according to claim 1, wherein said card casing has a switch for the setting of a write-protection.

10. The USB/OTG-interface storage card according to claim 1, wherein said memory unit is formed of a non-volatile memory.

11. The USB/OTG-interface storage card according to claim 1, wherein said memory unit is formed of a flash memory.

12. The USB/OTG interface storage card according to claim 1, wherein said card casing has a plurality of positioning press-fit slots.

13. The USB/OTG-interface storage card according to claim 1, wherein said USB/OTG interface has an appearance of fingers.

14. An USB/OTG-interface storage card, comprising:
    a card casing, with a plurality of openings on the perimeter of the bottom of said card casing; a circuit board disposed inside said card casing, wherein a plurality of planar USB/OTG interface units are formed on said circuit board to connect with an electronic device and said planar USB/OTG interface units outcrop from said openings; a memory unit, disposed on said circuit board; and a micro-controller, which controls the read/write activities of said memory unit to enable data to be written into said memory unit from said electronic device or to be read out from said memory unit into said electronic device.

15. The USB/OTG-interface storage card according to claim 14, wherein said USB/OTG interface units are formed on said circuit board with a direct layout.

16. The USB/OTG-interface storage card according to claim 14, wherein said electronic device is a portable electronic device.

17. The USB/OTG-interface storage card according to claim 14, wherein said electronic device is a digital camera.

18. The USB/OTG-interface storage card according to claim 14, wherein said electronic device is a computer.

19. The USB/OTG-interface storage card according to claim 14, wherein said electronic device is a notebook computer.

20. The USB/OTG-interface storage card according to claim 14, wherein said micro-controller further comprises an USB/OTG serial interface engine to transform said data of said micro-controller into electric signals.

21. The USB/OTG-interface storage card according to claim 14, wherein said card casing has a switch for the setting of a write-protection.

22. The USB/OTG-interface storage card according to claim 14, wherein said memory unit is formed of a non-volatile memory.

23. The USB/OTG-interface storage card according to claim 14, wherein said memory unit is formed of a flash memory.

24. The USB/OTG-interface storage card according to claim 14, wherein said USB/OTG-interface has an appearance of fingers.

25. The USB/OTG-interface storage card according to claim 14, wherein said card casing has a plurality of positioning press-fit slots.

26. The USB/OTG-interface storage card according to claim 14, which further comprises an USB/OTG serial interface engine to transform said data of said micro-controller into electric signals.

* * * * *